United States Patent [19]

Koshizuka

[11] Patent Number: 4,882,534
[45] Date of Patent: Nov. 21, 1989

[54] BIPOLAR-COMPLEMENTARY METAL OXIDE SEMICONDUCTOR INVERTER

[75] Inventor: Atsuo Koshizuka, Kawasaki, Japan

[73] Assignee: Fujitsu Limited, Kawasaki, Japan

[21] Appl. No.: 238,404

[22] Filed: Aug. 31, 1988

[30] Foreign Application Priority Data

Sep. 11, 1987 [JP] Japan ................. 62-228733

[51] Int. Cl.⁴ .................................. G05F 1/10
[52] U.S. Cl. ................................ 323/351; 307/446;
307/448; 307/451; 307/570
[58] Field of Search ............. 323/351; 307/446, 443,
307/448, 449, 450, 475, 451, 570, 270

[56] References Cited

U.S. PATENT DOCUMENTS

| | | | |
|---|---|---|---|
| 4,558,234 | 12/1985 | Suzuki et al. | 307/446 |
| 4,694,203 | 9/1987 | Uragami et al. | 307/448 X |
| 4,730,132 | 3/1988 | Watanabe et al. | 307/448 X |
| 4,740,718 | 4/1988 | Matsui | 307/446 |
| 4,769,561 | 9/1988 | Iwamura et al. | 307/446 |

FOREIGN PATENT DOCUMENTS 141128 8/1982 Japan .
212827 9/1982 Japan .
80929 5/1983 Japan .

Primary Examiner—Peter S. Wong
Assistant Examiner—Kristine Peckman
Attorney, Agent, or Firm—Staas & Halsey

[57] ABSTRACT

A bipolar-complementary metal oxide semiconductor (Bi-CMOS) inverter includes a CMOS inverter, an npn-type bipolar transistor, and an n-channel MOS transistor. An emitter of an n-channel MOS transistor of the CMOS inverter is connected to an emitter of the bipolar transistor and a drain of the MOS transistor. A gate of the MOS transistor is connected to an input of the CMOS inverter. When an input voltage applied to the CMOS inverter is switched to a high level, charges at an output of the CMOS inverter and at the emitter of the bipolar transistor are pulled out. During this time, the voltage at the output of the CMOS inverter decreases so as to follow the decrease of the voltage at the emitter of the bipolar transistor.

6 Claims, 4 Drawing Sheets

FIG. 1
PRIOR ART
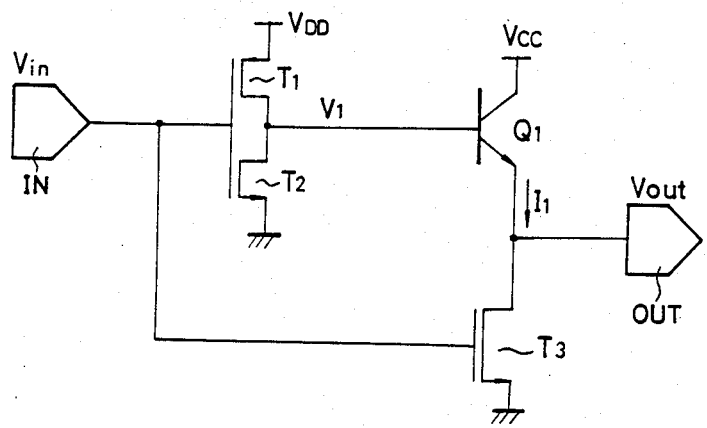
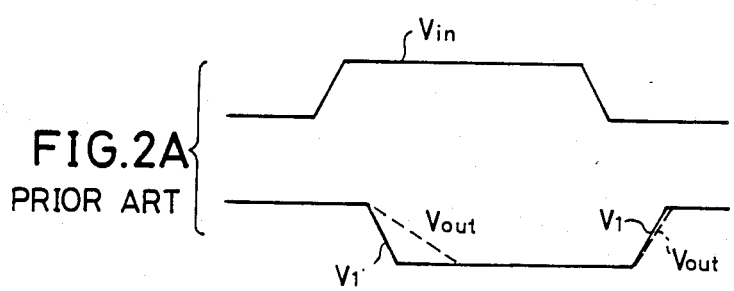
FIG. 2A
PRIOR ART
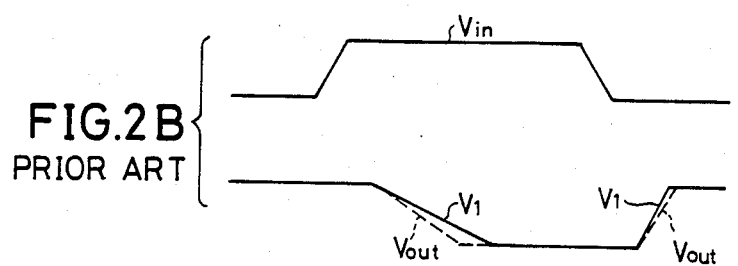
FIG. 2B
PRIOR ART FIG. 3
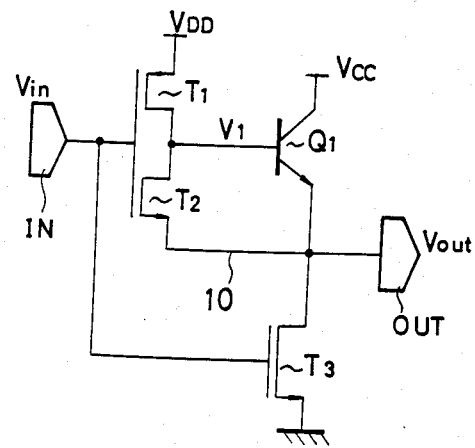
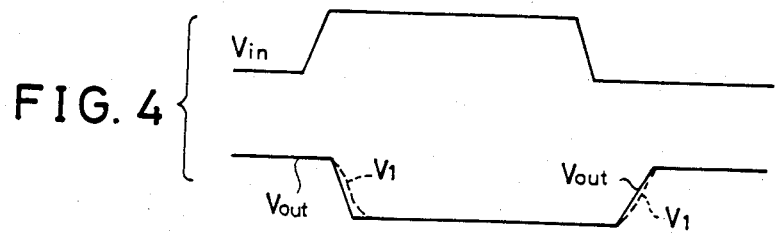
FIG. 4

BIPOLAR-COMPLEMENTARY METAL OXIDE SEMICONDUCTOR INVERTER

BACKGROUND OF THE INVENTION

The present invention generally relates to a bipolar-complementary metal oxide semiconductor inverter.

As is well known, a bipolar transistor has a driving capability greater than that of a complementary metal oxide semiconductor inverter (hereafter simply referred to as a CMOS inverter). Therefore, a bipolar transistor can charge up a load quickly, compared to a CMOS inverter. From this viewpoint, recently, there has been considerable activity in the development of a bipolar-CMOS inverter (hereafter simply referred to as a Bi-CMOS inverter) obtained by combining a bipolar transistor and a CMOS transistor. The CMOS inverter of the Bi-CMOS inverter performs a NOT operation for an input signal, and the bipolar transistor thereof drives a load coupled therewith in response to an output voltage of the CMOS inverter. The Bi-CMOS inverter contributes to an increased operational speed of a random access memory (RAM). Such Bi-CMOS inverters are disclosed in the Japanese Laid-Open Patent Application Nos. 141128/1982, 212827/1982 and 80929/1983, for example.

However, the conventional Bi-CMOS inverters have the following disadvantages. That is, when the input voltage is switched from a low level to a high level, the output voltage of the CMOS inverter may fall more quickly than the output voltage of the Bi-CMOS inverter which is applied to the load. Therefore, the p-n junction formed between the base and emitter of the bipolar transistor becomes biased in the reverse direction. As a result, a breakdown may be caused at the base-emitter junction.

The above problem can be overcome by making the output voltage of the CMOS inverter fall more slowly than the output voltage applied to the load. However, this causes an increased through current which passes through the bipolar transistor. The increased through current may introduce noise and causes an increased power consumption of the Bi-CMOS inverter.

SUMMARY OF THE INVENTION

Accordingly, a general object of the present invention is to provide a novel and useful Bi-CMOS inverter in which the above problems are eliminated.

A more specific object of the present invention is to provide a Bi-CMOS inverter in which the probability that a breakdown may be caused at the base-emitter junction of the bipolar transistor, is eliminated, so that reliability of the Bi-CMOS inverter is enhanced.

Another object of the present invention is to provide a bipolar-CMOS inverter having less through current and reduced power consumption.

The above objects of the present invention are achieved by a bipolar-CMOS inverter which includes p-channel and n-channel MOS transistors, an input voltage (Vin) being applied to gates of the MOS transistors, a bipolar transistor; a base of the bipolar transistor being connected to an output terminal of the CMOS inverter, an emitter of the bipolar transistor being connected to a source of the n-channel MOS transistor, an output voltage (Vout) of the Bi-CMOS inverter being obtained at the emitter of the bipolar transistor; and a transistor for forming a path through which charges at the output terminal of the CMOS inverter and at the emitter of the bipolar transistor are pulled out, when the input voltage is switched from a low level to a high level.

Other objects, features and advantages of the present invention will become apparent from the following detailed description when read in conjunction with the accompanying drawings.

BRIEF DESCRIPTION OF THE DRAWINGS

FIG. 1 is a circuit diagram of a conventional Bi-CMOS inverter;

FIGS. 2A and 2B show signal waveforms for explaining an operation of the Bi-CMOS inverter of FIG. 1;

FIG. 3 is a circuit diagram of a preferred embodiment of the present invention;

FIG. 4 shows signal waveforms for explaining an operation of the Bi-CMOS inverter of FIG. 3;

DESCRIPTION OF THE PREFERRED EMBODIMENT

Figure 5:
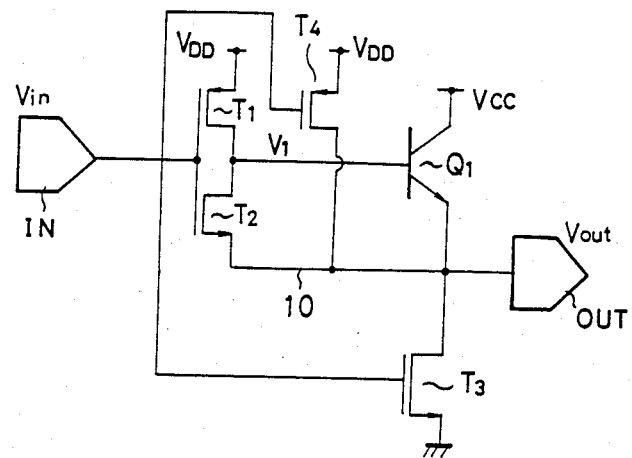
FIG. 5 shows a variation of the embodiment of FIG. 3.

To facilitate the understanding of the present invention, a description is given of a conventional Bi-CMOS inverter as shown in the aforementioned publications, with reference to FIGS. 1 and 2.

Referring to FIG. 1, a CMOS inverter is made up of MOS type field effect transistors (hereafter simply referred to as FETs) T1 and T2. FETs T1 and T2 are p-channel and n-channel FETs, respectively. Gates of the FETs T1 and T2 are mutually connected and are also connected to an input terminal IN. Drains of the FETs T1 and T2 are mutually connected. An output voltage V1 of the CMOS inverter is applied to an npn-type bipolar transistor Q1, which is used for driving a load (not shown) connected to an output terminal OUT. A FET T3 is an n-channel FET, and is connected as shown. A positive power source voltage $V_{DD}$ is applied to a source of the FET T1, and another positive power source $V_{CC}$ is applied to a collector of the transistor Q1. Generally, the voltages $V_{DD}$ and $V_{CC}$ are set identical to each other. Alternatively, the voltages $V_{DD}$ and $V_{CC}$ may be set different from each other. Sources of the FETs T2 and T3 are connected to the ground which acts as a negative power source.

An input voltage Vin is applied through the input terminal IN to the gates of the FETs T1, T2 and T3. The CMOS inverter inverts the input voltage Vin and produces a voltage V1. The polarity of the voltage V1 is opposite to that of the input voltage Vin. The voltage V1 is applied to the base of the transistor Q1, which then supplied an output voltage Vout to the output terminal OUT through the emitter of the transistor Q1.

The above Bi-CMOS inverter is designed so that the voltage V1 is decreased to the low level by turning ON the FET T2 through which the charge at the output terminal of the CMOS inverter is passed to the ground. The output voltage Vout is decreased to the low level by turning ON the the FET T3 through which the charge at the output terminal OUT is passed to the ground. When the input voltage Vin is changed from the low level to the high level as shown in FIG. 2A, the voltage V1 represented by a solid line may decrease faster than the output voltage Vout represented by a broken line. At this time, the p-n junction formed between the base and emitter of the transistor Q1 becomes biased in the reverse direction. In case where the transistor Q1 is constructed by a transistor having a low base-emitter breakdown voltage $V_{BEB}$, the transistor Q1 may be broken down. As a result, the circuit operation of FIG. 1 has a low reliability.

In order to overcome the above problem, it is conceivable to apply a FET of a small capability to the FET T2. In this case, as shown in FIG. 2B, the fall time of the voltage V1 is lengthened, compared to the fall time of the output voltage Vout. Thereby, it becomes possible to prevent occurrence of the breakdown at the p-n junction formed between the base and emitter of the transistor Q1. However, during a time when the voltages Vout and V1 fall, the p-n junction between the base and emitter of the transistor Q1 is forwardly biased, and therefore the transistor Q1 is kept ON. Thereby, a large quantity of the through current passes through the transistor Q1, which may introduces noise on the output signal. Additionally, an increased power is consumed.

The present invention intends to eliminate the above problems.

A description is given of a preferred embodiment of the present invention with reference to FIG. 3. In FIG. 3, elements identical to those in FIG. 1 are indicated by the same references.

One of the essential features of the present invention is that the source of the FET T2 is connected through a connection line 10 to the emitter of the transistor Q1 and the drain of the FET T3. Other connections between the elements are the same as those in FIG. 1. That is, the input terminal IN is connected to the gates of the FETs T1, T2 and T3. The drains of the FETs T1 and T2 are mutually connected, and is also connected to the base of the transistor Q1. The positive power source voltage $V_{DD}$ is applied to the source of the FET T1, and the positive power source voltage $V_{CC}$ is applied to the collector of the transistor Q1.

In operation, during a time when the input voltage Vin is kept at the low level, the FETs T1 and T2 are ON and OFF, respectively, and therefore the output voltage V1 of the CMOS inverter is kept at the high level. Further, during that time, the FET T3 is OFF, because the input voltage Vin at the low level is applied to the gate thereof. Therefore, the output terminal OUT is kept at a voltage approximately equal to the voltage Vcc.

On the other hand, during a time when the input voltage Vin is kept at the high level, the FETs T1 and T2 are OFF and ON, respectively, and the FET T3 is ON. Therefore, the voltage V1 at the low level is outputted from the CMOS inverter. The voltage V1 at the low level is applied to the base of the transistor Q1. As a result, the transistor Q1 is OFF, and the output voltage Vout at the low level is obtained at the output terminal OUT.

The above is the operation which is performed when the Bi-CMOS inverter is in the stationary states. At a transient time of the input voltage Vin, the Bi-CMOS inverter operates as follows.

As shown in FIG. 4, when the input voltage Vin is changed from the low level to the high level, both the the FETs T2 and T3 are turned ON. At this time, the FET T3 forms a path which connects the source of the FET T3 and the emitter of the transistor Q1 to the ground. A charge at the emitter of the transistor Q1 passes through the FET T3, and a charge at the output terminal of the CMOS inverter passes through the FETs T2 and T3. Thereby, the output voltage Vout decreases, and at the same time the voltage V1 is decreased. Since the source of the FET T2 is connected to the emitter of the transistor Q1, as shown in FIG. 4, the output voltage V1 of the CMOS inverter changes so as to follow up change of the output voltage Vout obtained at the emitter of the transistor Q1. Therefore, the p-n junction between the base and emitter of the transistor Q1 is prevented from being biased in the reverse direction, and at the same time is not forwardly biased. As a result, the probability of occurrence of the breakdown at the p-n junction can be eliminated, and the occurrence of the through current can be avoided.

FIG. 5 shows a variation of the above embodiment. The illustrated variation is obtained by adding a p-channel FET T4 to the circuit of FIG. 3. A gate of the FET T4 is connected to the input terminal IN. The positive power source voltage $V_{DD}$ is applied to the source of the FET T4, a drain of which is connected to the source of the FET T2 and the emitter of the transistor Q1. The FET T4 acts to charge the output terminal OUT up to the $V_{DD}$. That is, when the FET T4 is ON, the output voltage Vout is kept at the voltage $V_{DD}$. The operation of the Bi-CMOS inverter of FIG. 5 is the same as that of the Bi-CMOS inverter of FIG. 3.

Figure 6:
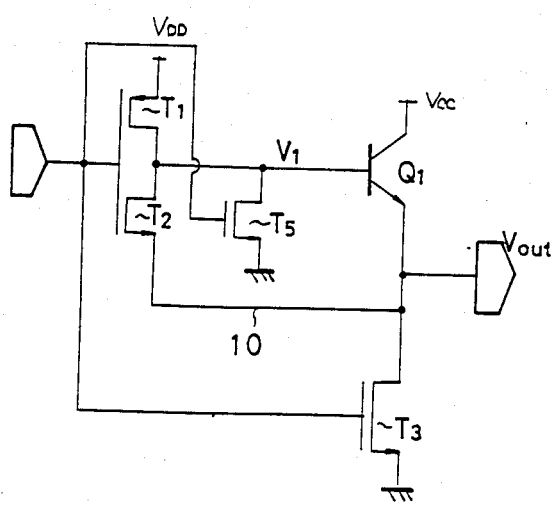
FIG. 6 shows another variation of the embodiment of FIG. 3.

FIG. 6 shows a third embodiment of the embodiment shown in FIG. 3. The illustrated variation is obtained by adding an n-channel FET T5 to the configuration of FIG. 3. A drain of the FET T5 is connected to the base of the transistor Q1, and a gate thereof is connected to the input terminal IN. A source of the FET T5 is connected to the ground. The FET T5 is used for discharging the base of the transistor Q1 when the input voltage Vin is switched to the high level.

Figure 7:
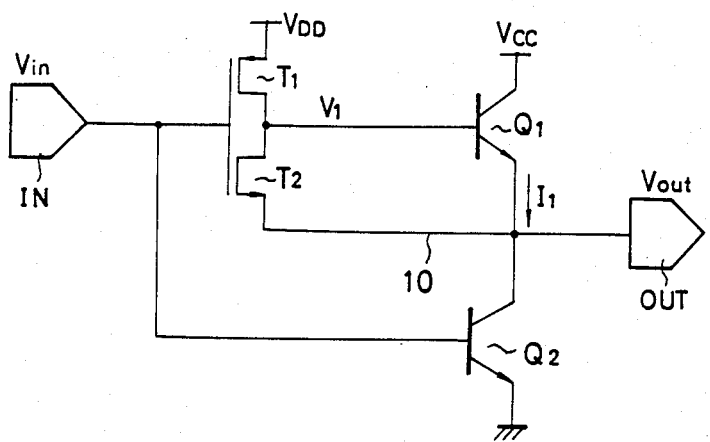
FIG. 7 shows yet another variation of the configuration of FIG. 3.

The FET T3 used in the above embodiments acts to pull the output voltage Vout down to the low voltage. The driving capability of the conventional MOSFET is sufficient for this operation. However, as shown in FIG. 7, an npn-type bipolar transistor Q2, which generally has a higher driving capability, may used in place of the FET T3.

The present invention is not limited to the embodiments, and variations and modifications may be made without departing from the scope of the invention.

What is claimed is:

1. A bipolar-complementary metal oxide semiconductor (Bi-CMOS) inverter comprising:
    a complementary metal oxide semiconductor (CMOS) inverter including a p-channel MOS transistor and an n-channel MOS transistor each having a gate, a source and a drain, an input voltage being applied to the gates of the MOS transistors;
    a bipolar transistor having a base, collector and emitter, the base of the bipolar transistor being connected to an output of the CMOS inverter, the emitter of the bipolar transistor being connected to the source of the n-channel MOS transistor, an output voltage of the Bi-CMOS inverter being obtained at the emitter of the bipolar transistor; and
    means for discharging the output of the CMOS inverter and an output of the emitter of the bipolar transistor, when the input voltage is switched from a low level to a high level.

2. A Bi-CMOS inverter as claimed in claim 1, wherein the source of the p-channel MOS transistor and the collector of said bipolar transistor are connected to a positive power source, and wherein said means comprises a second n-channel MOS transistor having a gate, a source and a drain, the gate of the second n-channel MOS transistor being connected to the gates of the p-channel and n-channel MOS transistors of said CMOS inverter, the drain of the second n-channel MOS transistor being connected to the emitter of said bipolar transistor, and the source of the second n-channel MOS transistor being connected to a negative power source.

3. A Bi-CMOS inverter as claimed in claim 1, wherein the source of the p-channel MOS transistor and the collector of said bipolar transistor are connected to a positive power source, and wherein said means comprises a second bipolar transistor having a base, a collector and an emitter, and wherein the base of the second bipolar transistor is connected to the gates of the p-channel and n-channel MOS transistors of said CMOS inverter, the collector of the second bipolar transistor is connected to the emitter of said bipolar transistor, and the emitter of the second bipolar transistor is connected to a negative power source.

4. A Bi-CMOS inverter as claimed in claim 1, further comprising pull-up means for pulling the output of the emitter of the bipolar transistor up to a predetermined voltage.

5. A Bi-CMOS inverter as claimed in claim 4, wherein the pull-up means comprises a pull-up MOS transistor having a gate, a source and a drain, and wherein the gate of the pull-up MOS transistor is connected to the gates of the p-channel and n-channel MOS transistors of said CMOS inverter, the drain of the pull-up MOS transistor is connected to the emitter of said bipolar transistor, and the source of the pull-up MOS transistor is connected to a positive power source, which is connected to the source of the p-channel MOS transistor of said CMOS inverter.

6. A Bi-CMOS inverter as claimed in claim 1, further comprising a second n-channel MOS transistor having a gate, a source and a drain, the drain of the second n-channel MOS transistor being connected to the base of the bipolar transistor, the gate of the second n-channel MOS transistor being connected to the gates of the p-channel and n-channel MOS transistors of said CMOS inverter, and the source of the second n-channel transistor being connected to a negative power source.

* * * * *